(12) United States Patent
Morita

(10) Patent No.: US 12,710,478 B2
(45) Date of Patent: Aug. 18, 2026

(54) POWER SUPPLY MONITORING DEVICE

(71) Applicant: DENSO CORPORATION, Kariya-city (JP)

(72) Inventor: Yoshinori Morita, Kariya-city (JP)

(73) Assignee: DENSO CORPORATION, Kariya (JP)

( * ) Notice: Subject to any disclaimer, the term of this patent is extended or adjusted under 35 U.S.C. 154(b) by 178 days.

(21) Appl. No.: 18/669,768

(22) Filed: May 21, 2024

(65) Prior Publication Data

US 2024/0302441 A1 Sep. 12, 2024

Related U.S. Application Data

(63) Continuation of application No. PCT/JP2022/040694, filed on Oct. 31, 2022.

(30) Foreign Application Priority Data

Nov. 23, 2021 (JP) ................................ 2021-189768

(51) Int. Cl.
*H02J 7/80* (2026.01)
*G01R 31/3835* (2019.01)

(52) U.S. Cl.
CPC ............ *G01R 31/3835* (2019.01); *H02J 7/80* (2026.01)

(58) Field of Classification Search
CPC ...... G01R 31/3835; H02J 7/0047; H02J 1/00; H02J 7/00; H02H 3/16
See application file for complete search history.

(56) References Cited

U.S. PATENT DOCUMENTS

| | | | | |
|---|---|---|---|---|
| 4,281,322 | A * | 7/1981 | Nasu ...................... | H01H 85/32 340/638 |
| 2005/0077878 | A1 * | 4/2005 | Carrier .................... | B60L 53/18 320/134 |
| 2015/0038092 | A1 * | 2/2015 | Andrys ................. | H03F 1/0233 327/318 |
| 2020/0216002 | A1 | 7/2020 | Mazaki et al. | |
| 2022/0169193 | A1 | 6/2022 | Mazaki et al. | |
| 2025/0046539 | A1 * | 2/2025 | Tannhäuser ............ | H01H 83/14 |

* cited by examiner

*Primary Examiner* — Feba Pothen
(74) *Attorney, Agent, or Firm* — Oliff PLC

(57) ABSTRACT

A power supply monitoring device is applied to a power supply system. The system includes a first system having a first load and a second system having a second load. The first and second systems are connectable by an inter-system switch. The second system is connected with a power supply unit. In the first system, loads are connected in parallel as the first load, and fuses are provided to energization paths connected to the loads. The device includes a monitoring unit monitoring voltage reduction in the first system when the first and second loads are driven in a state in which the inter-system switch is closed, and a switch operation unit allowing the inter-system switch to conduct electricity in a state in which a conduction current in the inter-system switch is limited during a time period from voltage reduction, if the monitoring unit determines that the voltage reduction has occurred.

8 Claims, 7 Drawing Sheets

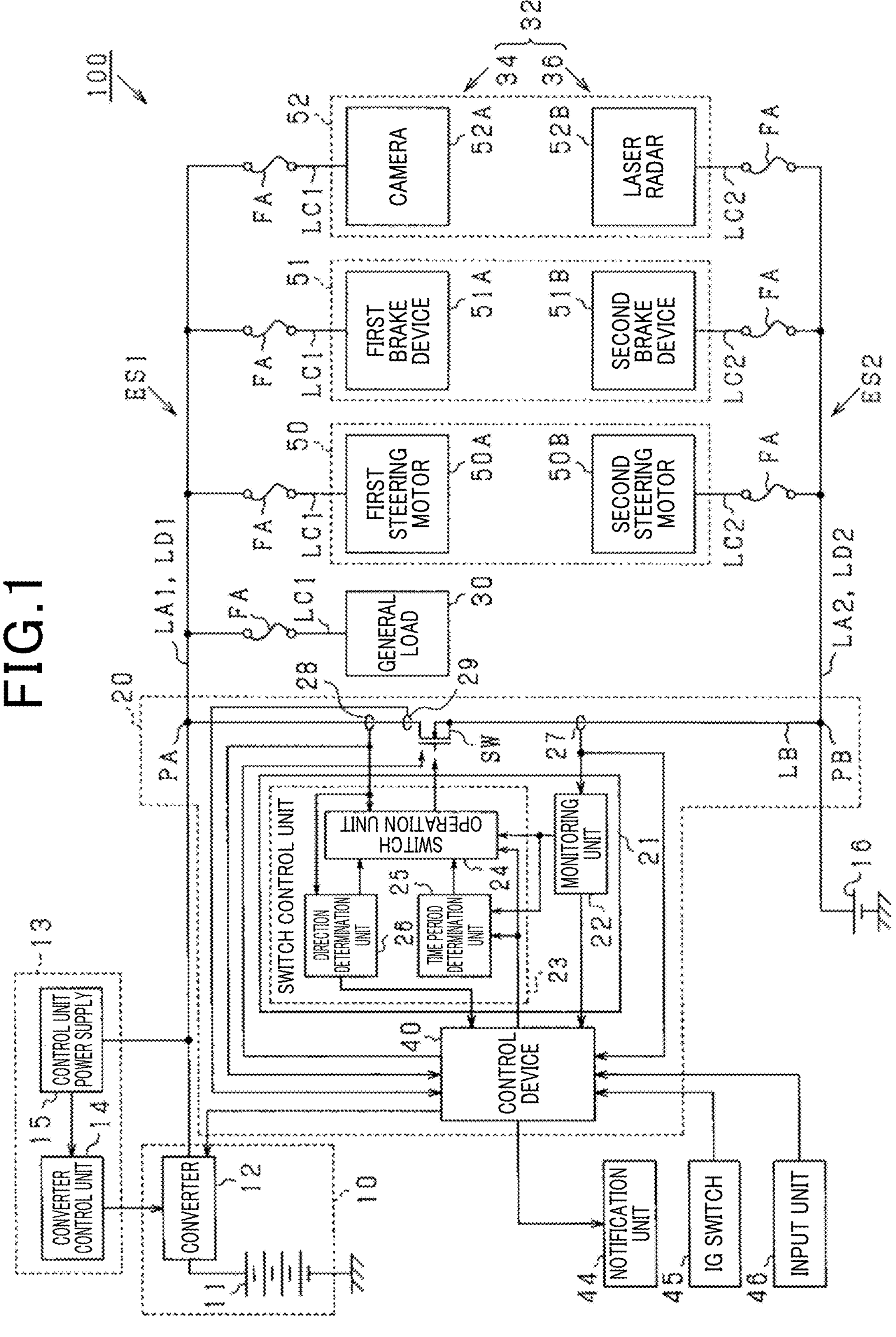

FIG.1
100
CAMERA
LASER RADAR
FIRST BRAKE DEVICE
SECOND BRAKE DEVICE
FIRST STEERING MOTOR
SECOND STEERING MOTOR
GENERAL LOAD
SWITCH OPERATION UNIT
SWITCH CONTROL UNIT
DIRECTION DETERMINATION UNIT
TIME PERIOD DETERMINATION UNIT
MONITORING UNIT
CONTROL DEVICE
CONTROL UNIT POWER SUPPLY
CONVERTER CONTROL UNIT
CONVERTER
NOTIFICATION UNIT
IG SWITCH
INPUT UNIT
ES1
ES2
LA1, LD1
LA2, LD2
LC1
LC2
FA
PA
PB
LB
SW

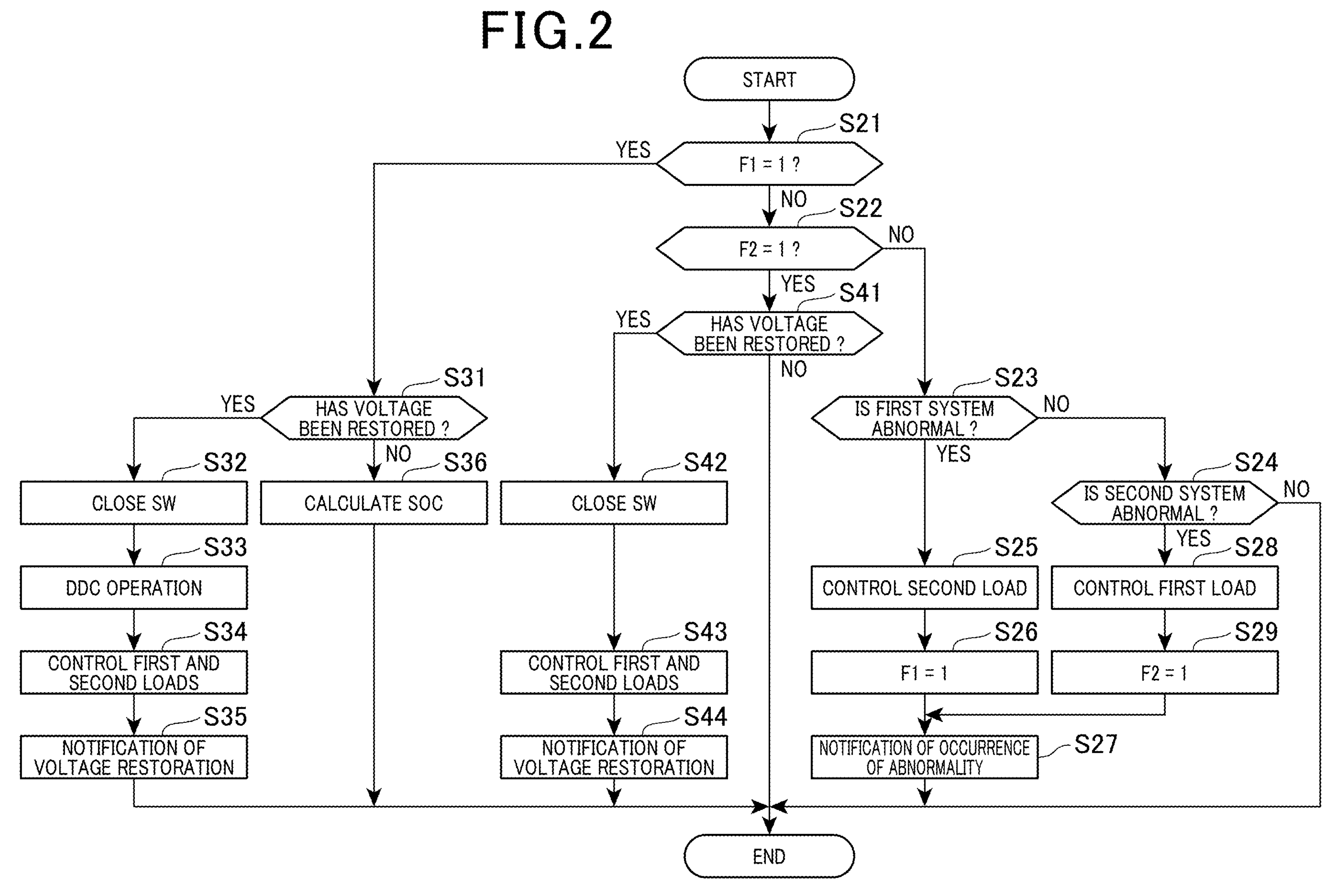
FIG.2
START
S21
F1 = 1 ?
YES
NO
S22
F2 = 1 ?
NO
YES
S41
HAS VOLTAGE BEEN RESTORED ?
YES
NO
S31
HAS VOLTAGE BEEN RESTORED ?
YES
NO
S32
CLOSE SW
S33
DDC OPERATION
S34
CONTROL FIRST AND SECOND LOADS
S35
NOTIFICATION OF VOLTAGE RESTORATION
S36
CALCULATE SOC
S42
CLOSE SW
S43
CONTROL FIRST AND SECOND LOADS
S44
NOTIFICATION OF VOLTAGE RESTORATION
S23
IS FIRST SYSTEM ABNORMAL ?
NO
YES
S24
IS SECOND SYSTEM ABNORMAL ?
NO
YES
S25
CONTROL SECOND LOAD
S28
CONTROL FIRST LOAD
S26
F1 = 1
S29
F2 = 1
S27
NOTIFICATION OF OCCURRENCE OF ABNORMALITY
END 100
ES1
ES2
LA1, LD1
LA2, LD2
GENERAL LOAD
FIRST STEERING MOTOR
SECOND STEERING MOTOR
FIRST BRAKE DEVICE
SECOND BRAKE DEVICE
CAMERA
LASER RADAR
FA
LC1
LC2
30
50
50A
50B
51
51A
51B
52
52A
52B
32
34
36
16
20
PA
PB
LB
SW
27
28
29
SWITCH CONTROL UNIT
SWITCH OPERATION UNIT
DIRECTION DETERMINATION UNIT
TIME PERIOD DETERMINATION UNIT
MONITORING UNIT
21
22
23
24
25
26
CONTROL DEVICE
40
CONVERTER
10
11
12
NOTIFICATION UNIT
IG SWITCH
INPUT UNIT
44
45
46

START
S21
F1 = 1 ?
YES
NO
S31
HAS VOLTAGE BEEN RESTORED ?
YES
NO
S23
IS FIRST SYSTEM ABNORMAL ?
NO
YES
S24
IS SECOND SYSTEM ABNORMAL ?
NO
YES
S32
CLOSE SW
S34
CONTROL FIRST AND SECOND LOADS
S35
NOTIFICATION OF VOLTAGE RESTORATION
S36
CALCULATE SOC
S25
CONTROL SECOND LOAD
S26
F1 = 1
S27
NOTIFICATION OF OCCURRENCE OF ABNORMALITY
S51
STOP CONTROL
S52
NOTIFICATION OF CONTROL STOP
END

POWER SUPPLY MONITORING DEVICE

CROSS-REFERENCE TO RELATED APPLICATION

The present application is based on and claims the benefit of priority from earlier Japanese Patent Application No. 2021-189768 filed on Nov. 23, 2021, the description of which is incorporated herein by reference.

BACKGROUND

Technical Field

The present disclosure relates to a power supply monitoring device.

RELATED ART

Recently, power supply systems are known which are applied to, for example, vehicles, and supply electrical power to various units of the vehicles. In addition, a device is known which has a first load and a second load as loads performing one function so that, in the power supply system, even when an abnormality has occurred in an electrical load performing functions required for driving of the vehicle, for example, an electric braking device and an electric steering device, the functions are not lost.

SUMMARY

An aspect of the present disclosure is a power supply monitoring device that is applied to a power supply system, the power supply system including a first system having a first load and a second system having a second load, the first system and the second system being connectable to each other by an inter-system switch, the second system being connected with a power supply unit. In the first system, a plurality of electrical loads are connected in parallel as the first load, and fuses are respectively provided to energization paths connected to the electrical loads. The power supply monitoring device includes: a monitoring unit that monitors voltage reduction in the first system when the first load and the second load are driven in a state in which the inter-system switch is closed; and a switch operation unit that allows the inter-system switch to conduct electricity in a state in which a conduction current in the inter-system switch is limited during a predetermined time period from voltage reduction, if the monitoring unit determines that the voltage reduction has occurred.

BRIEF DESCRIPTION OF THE DRAWINGS

In the accompanying drawings:

FIG. 1 is a diagram illustrating an overall configuration of a power supply system according to a first embodiment;

FIG. 2 is a flowchart illustrating a procedure of a control process according to the first embodiment;

DETAILED DESCRIPTION OF THE PREFERRED EMBODIMENTS

Figure 3:
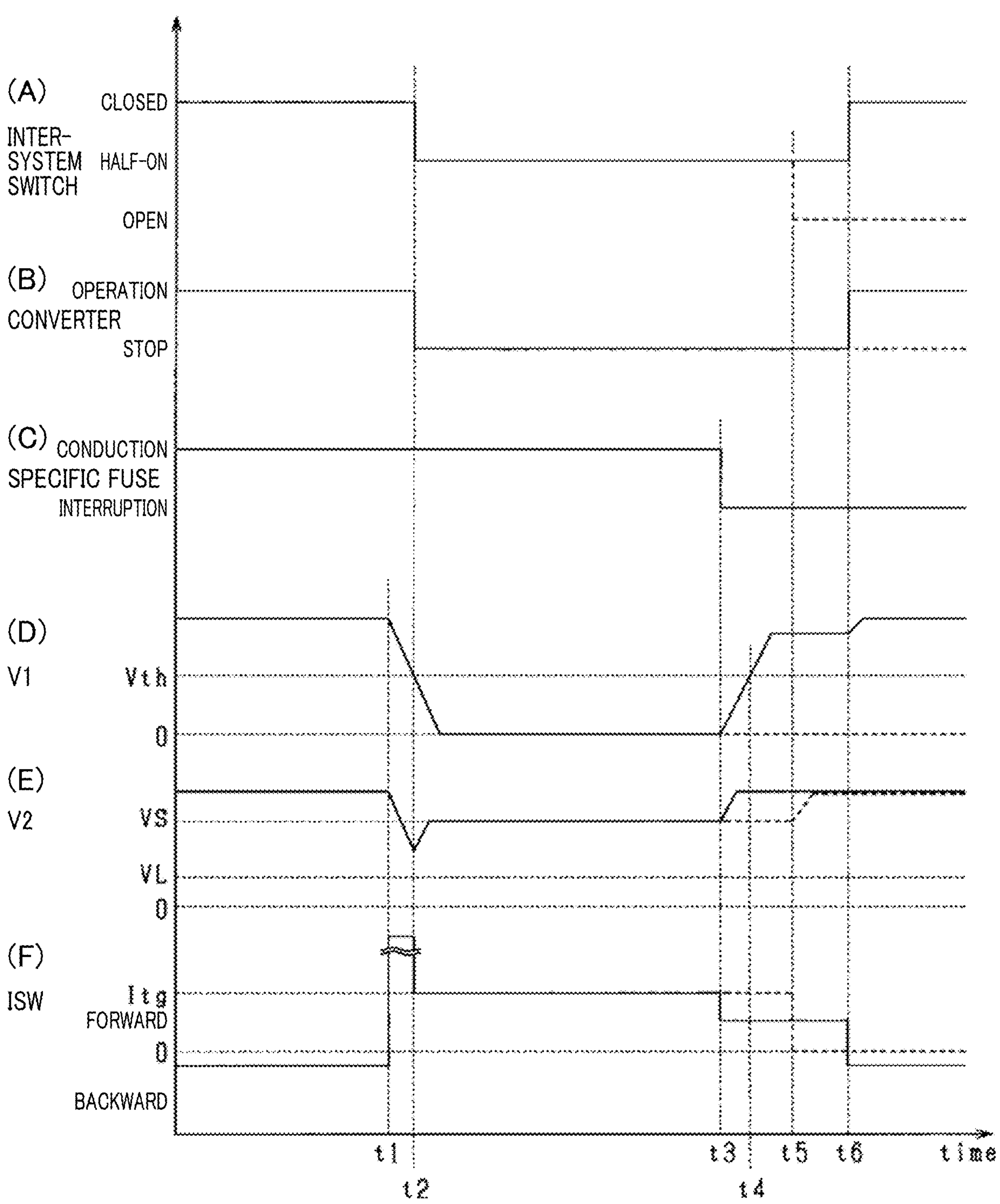
FIG. 3 is a timing diagram of a case in which a ground fault has occurred in a first system while a vehicle is traveling.

Recently, power supply systems are known which are applied to, for example, vehicles, and supply electrical power to various units of the vehicles. In addition, a device is known which has a first load and a second load as loads performing one function so that, in the power supply system, even when an abnormality has occurred in an electrical load performing functions required for driving of the vehicle, for example, an electric braking device and an electric steering device, the functions are not lost.

As a power supply system applied to the device, for example, JP 2019-62727 A discloses a configuration including a first system having a first load and a second system having a second load. In this power supply system, an inter-system switch is provided to a connection path connecting the systems. The inter-system switch is opened by a control device when a ground fault has occurred in one of the systems and a short-circuit current has flowed through the connection path. Hence, functions required for driving of the vehicle are ensured by the load of the other of the systems, in which no short circuit has occurred.

In the above power supply system, it can be considered that a plurality of electrical loads are included as the first load of the first system. In such a configuration, for example, if a ground fault has occurred in one of the plurality of electrical loads, the inter-system switch is opened. However, there is a concern about disadvantages such that remaining electrical loads in which no ground fault has occurred cannot be used.

In view of the above points, the present disclosure has an object of providing a power supply monitoring device that can appropriately use electrical loads even after a ground fault has occurred.

First Embodiment

Hereinafter, an embodiment in which a power supply monitoring device according to the present disclosure is applied to an in-vehicle power supply system 100 will be described with reference to the drawings.

As illustrated in FIG. 1, the power supply system 100 has two power supply systems. A first system ES1, which is one of the power supply systems, is provided with a power supply device 10 as a first power supply unit. A second system ES2, which is the other of the power supply systems, is provided with a storage battery 16 as a second power supply unit.

The power supply device 10 and the storage battery 16 are power sources that supply electrical power to a general load 30 and specific loads 32. The power supply device 10 includes a high-voltage storage battery 11 and a DC/DC converter (hereinafter, simply converter) 12. The high-voltage storage battery 11 can output a voltage (e.g., several hundred V) higher than a rated voltage (e.g., 12V) of the storage battery 16 and is, for example, a lithium-ion storage battery. The converter 12 is a voltage converter that steps down electrical power supplied from the high-voltage storage battery 11 to generate operating voltage of the general load 30 and the specific load 32. The storage battery 16 is an electrical storage device configured by, for example, a lithium-ion storage battery.

The general load 30 is an electrical load (hereinafter, simply load) that is not used for driving of a vehicle, and is, for example, an air conditioner, an audio device, a power window, and the like.

In contrast, the specific load 32 is a load that performs at least one function used for driving of the vehicle, and is, for example, an electric power steering device 50 that steers the vehicle, an electric braking device 51 that applies braking force to wheels, a travel monitoring device 52 that monitors states around the vehicle, and the like.

The specific load 32 has a configuration in which redundancy is applied to each function and has a first load 34 and a second load 36, whereby not all the functions are lost even if an abnormality has occurred in any one of the loads 34 and 36. Specifically, the electric power steering device 50 has a first steering motor 50A and a second steering motor 50B. The electric braking device 51 has a first braking device 51A and a second braking device 51B. The travel monitoring device 52 has a camera 52A and a laser radar 52B. The first steering motor 50A, the first braking device 51A, and the camera 52A correspond to a first load 34. The second steering motor 50B, the second braking device 51B, and the laser radar 52B correspond to a second load 36.

The first load 34 and the second load 36 are redundantly provided for each function and cooperate with each other to implement each of the functions. However, each of the first load 34 and the second load 36 can individually implement part of each of the functions. For example, in the electric power steering device 50, the vehicle can be steered freely by the first steering motor 50A and the second steering motor 50B. Within certain limitations of steering speed, steering range, and the like, the vehicle can be steered by the steering motor 50A, 50B.

In the first system ES1, the power supply device 10 is connected to the general load 30 and the first load 34 via a first in-system path LA1. In the present embodiment, the first system ES1 is configured by the power supply device 10, the general load 30, and the first load 34 connected by the first in-system path LA1. It is noted that, in the present embodiment, in the first system ES1, the low voltage side of the converter 12 is connected with a power storage device such as a storage battery.

In addition, in the second system ES2, the storage battery 16 is connected to the second load 36 via a second in-system path LA2. In the present embodiment, the second system ES2 is configured by the storage battery 16 and the second load 36 connected by the second in-system path LA2.

The in-system paths LA1, LA2 are connected to each other by a connection path LB, which is provided with an inter-system switch SW. One end of the connection path LB is connected to a connection point PA on the first in-system path LA1. The other end of the connection path LB is connected to a connection point PB on the second in-system path LA2. In the present embodiment, as the inter-system switch SW, an N-channel MOSFET (hereinafter, simply MOSFET) is used. It is noted that, in the present embodiment, the first in-system path LA1, the second in-system path LA2, and the connection path LB correspond to an energization path.

The connection path LB is provided with a voltage sensor 27 that detects a voltage at the connection point PA, a current sensor 28 that detects a conduction current ISW flowing to the inter-system switch SW, and a temperature sensor 29 that detects a temperature of the inter-system switch SW. In the present embodiment, the voltage sensor 27 is provided on the second system ES2 side with respect to the inter-system switch SW. The current sensor 28 is provided on the first system ES1 side with respect to the inter-system switch SW.

The first in-system path LA1 is connected with a plurality of loads, which are included in the first load 34, and the general load 30 in parallel. First branch paths LC1 connected to the electrical paths are respectively provided with fuses FA. When excess current flows, the fuse FA blows and interrupts input and output of electrical power to the corresponding load and the like. It is noted that the fuse FA is not limited to a blowout type fuse but may be, for example, a semiconductor fuse that interrupts current when an overcurrent is detected, or a chemical fuse. The first branch paths LC1 are connected to a first main path LD1 before the branch and are connected to the power supply device 10 via the first main path LD1.

The second in-system path LA2 is connected with a plurality of loads included in the second load 36 in parallel. Second branch paths LC2 connected to the electrical paths are respectively provided with fuses FA. The second branch paths LC2 are connected to a second main path LD2 before branch and is connected to the storage battery 16 via the second main path LD2.

A control device 40 includes a well-known microcomputer including a CPU, a ROM, a RAM, a flash memory, and the like. The CPU refers to an arithmetic program and control data in the ROM to implement various functions for manual driving and autonomous driving. Specifically, the control device 40 controls open and closed states of the inter-system switch SW. In addition, the control device 40 switches between an operating state and an operation stopped state of the converter 12.

In addition, the control device 40 can perform driving assist functions such as LKA (Lane Keeping Assist), ACC (Adaptive Cruise Control), and PCS (Pre-Crash Safety). The control device 40 can change a travel mode of the vehicle between an assist mode using driving assist control and a normal mode not using the driving assist control. The vehicle can travel according to each of the travel modes.

The control device 40 is connected to a notification unit 44, an IG switch 45, and an input unit 46. The notification unit 44 is a device visually or audibly providing a notification to a driver, and is, for example, a display or a speaker installed in the vehicle interior. The IG switch 45 is a start switch of the vehicle. The control device 40 monitors open and closed states of the IG switch 45. The input unit 46 is a device that accepts operations from the driver, and may be, for example, a steering wheel operation input device, a shift lever operation input device, an accelerator pedal operation input device, a brake pedal operation input device, and a sound input device.

The power supply system 100 includes a converter monitoring device 13. The converter monitoring device 13 has a converter control unit 14 and a control unit power supply 15. The control unit power supply 15 is connected to the first in-system path LA1 and receives electrical power supplied from the first in-system path LA1 to generate a drive voltage of the converter control unit 14. The converter control unit 14 is connected to the converter 12 and the control unit power supply 15, and is a hardware circuit including a switching circuit that switches between an operating state and an operation stopped state of the converter 12 by the drive voltage supplied from the control unit power supply 15. In the operating state of the converter 12, if the voltage of the first in-system path LA1 has decreased to a predetermined threshold voltage Vth or lower due to voltage reduction in the first system ES1, the converter control unit 14 switches the converter 12 from the operating state to the operation stopped state to stop voltage generation by the converter 12.

In addition, the power supply system 100 includes a switch monitoring device 21. The switch monitoring device 21 has a monitoring unit 22 and a switch control unit 23. The monitoring unit 22 is connected to the voltage sensor 27, and is a hardware circuit including a voltage determination circuit that determines whether the voltage value detected by the voltage sensor 27 has decreased to a threshold voltage Vth or lower. The switch control unit 23 is connected to the monitoring unit 22, the inter-system switch SW, and the like, and is a hardware circuit including a voltage adjustment circuit that adjusts a voltage input to a gate terminal of the inter-system switch SW. The switch control unit 23 adjusts the voltage input to the gate terminal of the inter-system switch SW to change open and closed states of the inter-system switch SW.

In a state in which the inter-system switch SW is closed by the control device 40, when the first load 34 and the second load 36 are driven, the monitoring unit 22 monitors voltage reduction in the first system ES1. For example, if the monitoring unit 22 determines that voltage reduction in the first system ES1 has occurred, the inter-system switch SW is opened, and the first system ES1 and the second system ES2 are electrically insulated, whereby functions necessary for drive of the vehicle are ensured by the second load 36 of the second system ES2 on which no short circuit has occurred.

Incidentally, as a power failure of the power supply system 100, when a ground fault has occurred in one of a plurality of loads included in the first load 34, if the inter-system switch SW is opened, there is a concern about disadvantages such that, of the plurality of loads included in the first load 34, remaining loads in which no ground fault has occurred cannot be used.

That is, when a ground fault has occurred in one of the plurality of loads included in the first load 34, the converter control unit 14 stops voltage generation by the converter 12. In this case, if the inter-system switch SW is opened, in the first system ES1, electric power is lost which is for interrupting the fuse FA on the first branch path LC1 connected to the load in which a ground fault has occurred. As a result, the remaining loads in which no ground fault has occurred cannot be used.

In the present embodiment, after the IG switch 45 is turned on, the control device 40 turns on the inter-system switch SW. In this state, electrical power is supplied to the loads 34, 36 of the systems ES1, ES2 from the power supply device 10. In addition, under the on state of the inter-system switch SW, if the monitoring unit 22 determines that voltage reduction has occurred in the first system ES1, a switch operation unit 24 included in the switch control unit 23 produces a state in which the inter-system switch SW is allowed to conduct electricity in a state in which the conduction current ISW of the inter-system switch SW is limited, that is, a half-on state, during a temporal time period from the voltage reduction, that is, during a predetermined time period from the voltage reduction.

Response of the switch control unit 23 to a case in which a power failure has occurred will be described. The switch control unit 23 is a hardware circuit including the switch operation unit 24, a time period determination unit 25, and a direction determination unit 26.

If the monitoring unit 22 determines that voltage reduction in the first system ES1 has occurred, the switch operation unit 24 sets the inter-system switch SW to a half-on state. Hence, energization is performed from the storage battery 16 on the second system ES2 side to the first system ES1 side, whereby the fuse FA on an energization path connected to a load in which a ground fault has occurred is interrupted. When making the inter-system switch SW a half-on state, the switch operation unit 24 adjusts energization resistance between main terminals of the inter-system switch SW to limit the conduction current ISW of the inter-system switch SW. In this case, the switch operation unit 24 adjusts the conduction current ISW of the inter-system switch SW based on SOC of the storage battery 16 acquired from the control device 40. Specifically, the switch operation unit 24 sets a target current value of the conduction current ISW so as to be larger as the SOC of the storage battery 16 is higher, and performs feed back control for the energization resistance of the inter-system switch SW so that the magnitude of the conduction current ISW acquired using the current sensor 28 becomes the target current value. It is noted that, in the present embodiment, the switch operation unit 24 corresponds to a current adjustment unit.

If the monitoring unit 22 determines that voltage reduction has occurred in the first system ES1, the time period determination unit 25 determines whether a predetermined conduction time period has elapsed from the voltage reduction. Specifically, the time period determination unit 25 acquires SOC (State Of Charge) indicating a state of charge of the storage battery 16 from the control device 40. If ΔSOC, which is a variation of SOC from when the monitoring unit 22 determined that voltage reduction had occurred in the first system ES1, is larger than a predetermined threshold value variation, the time period determination unit 25 determines that the predetermined conduction time period has elapsed from the voltage reduction.

In the first system ES1, other than the occurrence of a ground fault in any of the loads included in the first load 34, it can be considered that a ground fault may occur on the first main path LD1 before branching to the loads. In this case, even if current flows from the storage battery 16 to the first system ES1 side, the fuse FA is not interrupted, and a continuous flow of current unnecessarily consumes electrical power of the storage battery 16. Hence, after voltage reduction in the first system ES1 has occurred, if the time period determination unit 25 determines that the predetermined conduction time period has elapsed, the switch operation unit 24 opens the inter-system switch SW.

In addition, it can be considered that a ground fault occurs in the second system ES2 in the power supply system 100. In such a state, it is not necessary to interrupt the fuse on the first system ES1 side, and the inter-system switch SW is interrupted. In this case, depending on whether a ground fault has occurred in the first system ES1 or the second system ES2, the direction in which the conduction current ISW 20) flows to the inter-system switch SW changes. Hence, the direction determination unit 26 determines the direction in which the conduction current ISW flows to the inter-system switch SW using the current sensor 28.

When voltage reduction occurs in the first system ES1, if the direction determination unit 26 determines that the conduction current ISW is flowing from the second system ES2 to the first system ES1, the switch operation unit 24 sets the inter-system switch SW to a half-on state. If the direction determination unit 26 determines that the conduction current ISW is flowing from the first system ES1 to the second system ES2, the switch operation unit 24 opens the inter-system switch SW.

Next, response of the control device 40 to a case in which a power failure has occurred will be described. FIG. 2 is a flowchart illustrating a control process performed by the control device 40 when a power failure has occurred. When the IG switch 45 is closed, the control device 40 repeatedly performs the control process at predetermined intervals.

When the control process starts, first in step S21, whether a first abnormity flag F1 is 1 is determined. When no abnormalities have occurred in the first system ES1, the first abnormity flag F1 is set to 0. When an abnormality has occurred in the first system ES1, the first abnormity flag F1 is set to 1. If it is determined that the first abnormity flag F1 is 0, the process proceeds to step S22. If it is determined that the first abnormity flag F1 is 1, the process proceeds to step S31.

In step S22, whether a second abnormity flag F2 is 1 is determined. When no abnormalities have occurred in the second system ES2, the second abnormity flag F2 is set to 0. When an abnormality has occurred in the second system ES2, the second abnormity flag F2 is set to 1. If it is determined that the second abnormity flag F2 is 0, the process proceeds to step S23. If it is determined that the second abnormity flag F2 is 1, the process proceeds to step S41.

In step S23, it is determined whether an abnormality has occurred in the first system ES1. If no abnormalities have occurred in the first system ES1, in step S24, it is determined whether an abnormality has occurred in the second system ES2. The control device 40 acquires determination results from the monitoring unit 22 and the direction determination unit 26 to determine whether an abnormality has occurred in any of the first system ES1 and the second system ES2. It is noted that, in the present embodiment, the abnormality is a power supply failure such as a ground fault, a short circuit, or the like.

If it is determined that an abnormality has occurred in the first system ES1, in step S25, the load to be controlled is changed from the first and second loads 34, 36 to the second load 36. In succeeding step S26, the first abnormity flag F1 is changed to 1. In succeeding step S27, a notification of occurrence of an abnormality is provided to the driver via the notification unit 44, and the present process halts.

In addition, if it is determined that an abnormality has occurred in the second system ES2, in step S28, the load to be controlled is changed from the first and second loads 34, 36 to the first load 34. In succeeding step S29, the second abnormity flag F2 is changed to 1, and the present process proceeds to step S27. In contrast, if it is determined that no abnormalities have occurred in either of the first and second system ES1, ES2, the present process halts.

In step S31, it is determined whether voltage restoration has occurred from the voltage reduction in the first system ES1. For example, in the first system ES1, when a ground fault has occurred in at least one of the plurality of loads included in the first load 34 and the general load 30, the switch operation unit 24 sets the inter-system switch SW to a half-on state, whereby current flows from the storage battery 16 to the load in which the ground fault has occurred. Hence, if the fuse FA corresponding to the load blows, the voltage in the first system ES1 is restored.

When voltage restoration has occurred, in step S32, the limitation of the conduction current ISW of the inter-system switch SW by switch operation unit 24 is canceled to restore the inter-system switch SW to a conduction state in which there is no current limitation. It is noted that, in the present embodiment, the processing in step S31 corresponds to a restoration determination unit, and the processing in step S32 corresponds to a restoration operation unit.

In step S33, the converter 12 is changed from the operation stopped state to the operating state. In succeeding step S34, the load to be controlled is changed from the first load 34 to the first and second loads 34, 36, and the control of the first load 34 is restarted. In the succeeding step S35, a notification of voltage restoration is provided to the driver via the notification unit 44, and the present process halts.

In contrast, when no voltage restoration has occurred, in step S36, SOC of the storage battery 16 is calculated, and the present process halts. The SOC of the storage battery 16 calculated in step S32 is transmitted to the switch operation unit 24 and the time period determination unit 25.

In step S41, it is determined whether voltage restoration has occurred from the voltage reduction in the second system ES2. For example, in the second system ES2, when a ground fault has occurred in at least one of the plurality of loads included in the second load 36, the switch operation unit 24 sets the inter-system switch SW to an open state. In this case, in the second system ES2, current flows from the storage battery 16 to the load in which the ground fault has occurred. Hence, if the fuse FA corresponding to the load blows, voltage restoration occurs in the second system ES2.

When voltage restoration has occurred, in step S42, the inter-system switch SW is opened. In succeeding step S43, the load to be controlled is changed from the second load 36 to the first and second loads 34, 36 to restart the control of the second load 36. In succeeding step S44, a notification of the voltage restoration is provided to the driver via the notification unit 44, and the present process halts. In contrast, when no voltage restoration has occurred, the present process halts.

FIG. 3 illustrates changes of a first voltage V1 of the first in-system path LA1 and a second voltage V2 of the second in-system path LA2 in a case in which a ground fault has occurred in the first system ES1 while the travel is traveling. Here, the first voltage V1 is a voltage at the connection point PA, and the second voltage V2 is a voltage at the connection point PB.

In FIG. 3, (A) illustrates a change of open and closed states of the inter-system switch SW. (B) illustrates a change of an operation state of the converter 12. (C) illustrates a change of a conduction state of a specific fuse. Here, the specific fuse refers to the fuse FA on the branch path LC1 or LC2 connected to the load in which a ground fault has occurred. When a ground fault has occurred on the path LD1 or LD2, there is no specific fuse.

In addition, (D) illustrates a change of the first voltage V1. (E) illustrates a change of the second voltage V2. (F) illustrates a change of the conduction current ISW. The forward direction of the flowing conduction current ISW is from the second system ES2 side to the first system ES1 side.

As illustrated in FIG. 3, before time t1, the inter-system switch SW is closed by the control device 40, and the converter 12 is set to an operating state by the control device 40. In addition, the first and second voltages V1, V2 are higher than the threshold voltage Vth, whereby the storage battery 16 is appropriately charged by operating voltage of the converter 12.

While the vehicle is traveling, it is determined whether an abnormality has occurred in any one of the first system ES1 and the second system ES2. In FIG. 3, at time t1, a ground fault occurs in the first system ES1. Hence, the first voltage V1 decreases, and the conduction current ISW flowing from the second system ES2 side to the first system ES1 side increases. When the first voltage V1 decreases to the threshold voltage Vth at time t2, the converter 12 is changed from the operating state to the operation stopped state by the converter control unit 14, whereby voltage generation by the converter 12 is stopped.

In addition, when the first voltage V1 decreases to the threshold voltage Vth, the monitoring unit 22 determines that voltage reduction has occurred in the first system ES1, and the switch operation unit 24 sets the inter-system switch SW to a half-on state. Hence, the second voltage V2 increases to a limit voltage VS higher than the threshold voltage Vth, whereby the second voltage V2 is prevented from decreasing to an operation lower limit voltage VL of the second load 36 set to be lower than the threshold voltage Vth.

When the inter-system switch SW is set to a half-on state, energization resistance of the inter-system switch SW is subjected to feedback control so that the magnitude of the conduction current ISW becomes a target current value. The target current value is set so that operating voltage of the second load 36 can be ensured by electrical power supplied from the storage battery 16 and can cause the specific fuse to blow. Performing the feedback control so that the magnitude of the conduction current ISW becomes the target current value can cause a blowout of the specific fuse while suppressing problems from occurring in operation of the second load 36, whereby only the load in which a ground fault has occurred in the first system ES1 can be separated from the first system ES1.

FIG. 3 illustrates changes of the values in a case in which a ground fault has occurred in the loads 30, 34 of the first system ES1, by solid lines, and illustrates changes of the values in a case in which a ground fault has occurred on the first main path LD1 of the first system ES1, by broken lines.

As illustrated by the solid lines in FIG. 3, when a ground fault has occurred in the loads 30, 34 of the first system ES1, if the specific fuse is blown at time t3, the first voltage V1 increases, and the conduction current ISW decreases. In this case, the time period from time t2 to time t3 corresponds to a predetermined time period.

The control device 40 acquires the second voltage V2 using a voltage sensor 27 provided on the second system ES2 side with respect to the inter-system switch SW. If the second voltage V2 increases from the limit voltage VS at time t3, the control device 40 determines that voltage restoration has occurred in the first system ES1. In the present embodiment, the control device 40 determines that voltage restoration has occurred in the first system ES1 at time t4 after a specified time period has elapsed from time t3. The specified time period is, for example, a time period required for the first voltage V1 to increase from zero to the threshold voltage Vth.

Based on this determination, the control device 40 opens the inter-system switch SW at time t6, that is, sets the inter-system switch SW to a conduction state in which there is no current limitation, and changes the converter 12 from the operation stopped state to the operating state. Hence, the remaining loads 30, 34 of the first system ES1 can be used, and electrical power can be redundantly supplied to the remaining loads 30, 34.

It is noted that, during the time period from time t3 to time t6, although the specific fuse is blown, since the inter-system switch SW is in a half-on state, the second voltage V2 is lower than the first voltage V1.

In contrast, as illustrated by the broken lines in FIG. 3, in a case in which voltage reduction on the first system ES1 continues though ΔSOC of the storage battery 16 increases to the threshold value variation at time t5, the switch operation unit 24 opens the inter-system switch SW. Hence, the conduction current ISW becomes zero, whereby capacity of the storage battery 16 is suppressed from lowering. In this case, the time period from time t2 to time t5 corresponds to a conduction time period.

Figure 4:
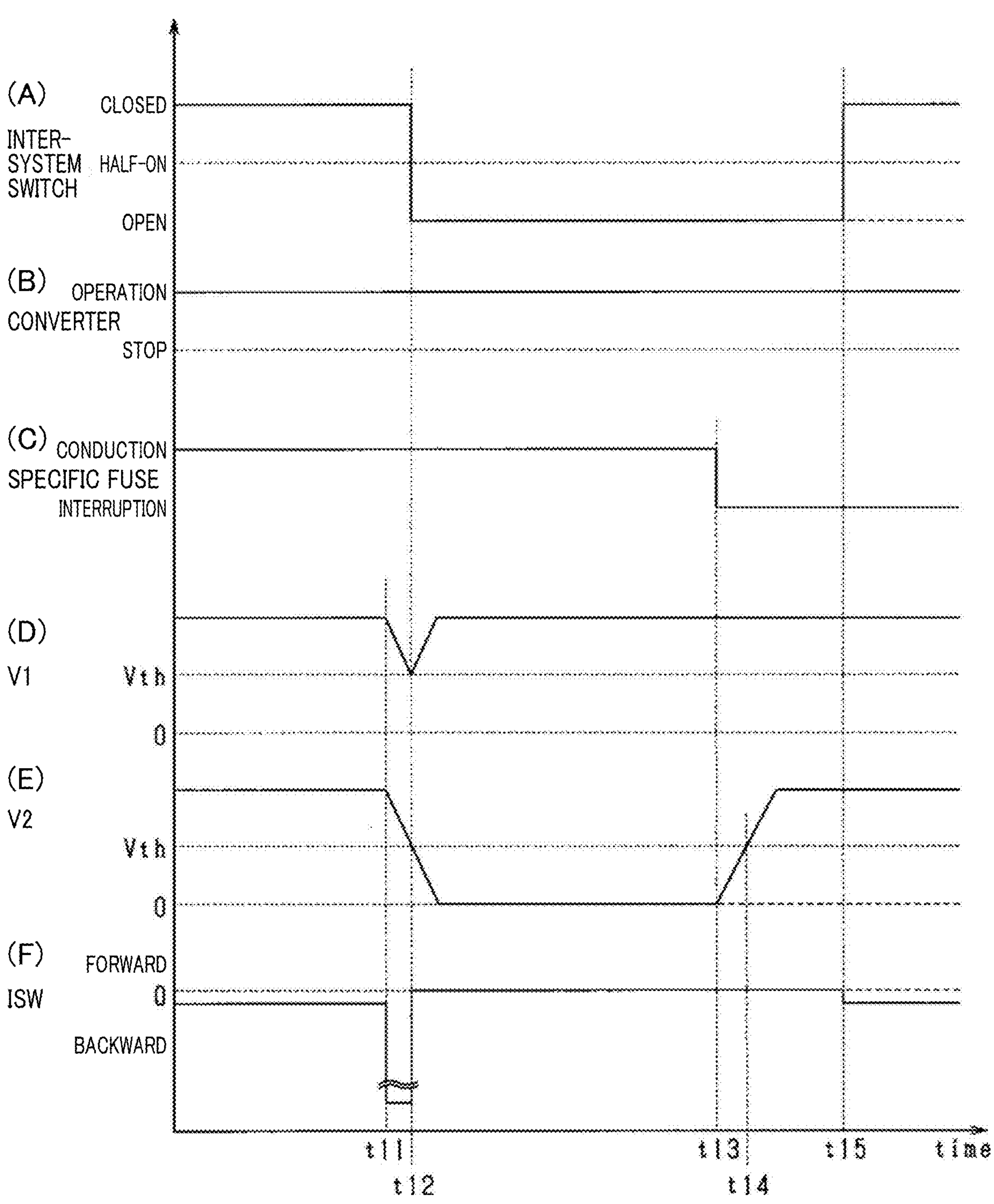
FIG. 4 is a timing diagram of a case in which a ground fault has occurred in a second system while a vehicle is traveling.

FIG. 4 illustrates changes of the first voltage V1 and the second voltage V2 in a case in which a ground fault has occurred in the second system ES2 while the vehicle is traveling. It is noted that since FIGS. 4 (A) to (F) correspond to FIGS. 3 (A) to (F), redundant descriptions thereof are omitted.

In FIG. 4, at time t11, a ground fault occurs in the second system ES2. Hence, the second voltage V2 decreases, and the conduction current ISW flowing from the first system ES1 side to the second system ES2 side increases. If the first voltage V1 decreases to the threshold voltage Vth at time t12 along with the decrease of the second voltage V2, the monitoring unit 22 determines that voltage reduction has occurred in the first system ES1, and the direction determination unit 26 determines that the conduction current ISW is flowing from the first system ES1 side to the second system ES2. Based on these determinations, if the switch operation unit 24 determines that a ground fault has occurred in the second system ES2, the inter-system 25 switch SW is opened.

When a ground fault has occurred in the second system ES2, the inter-system switch SW is opened, whereby operating voltages of the loads 30, 34 of the first system ES1 are ensured. In addition, even if the inter-system switch SW is opened, since the storage battery 16 serving as a power resource for interrupting the specific fuse is provided in the second system ES2, electrical power supplied from the storage battery 16 can causes a blowout of the specific fuse. Hence, while problems are suppressed from occurring in operation of the loads 30, 34 of the first system ES1, only the second load 36 in which a ground fault has occurred in the second system ES2 can be separated from the second system ES2.

FIG. 4 illustrates changes of the values in a case in which a ground fault has occurred in the second load 36 of the second system ES2, by solid lines, and illustrates changes of values in a case in which a ground fault has occurred in the second main path LD2 of the second system ES2, by broken lines.

As illustrated by the solid lines in FIG. 4, when a ground fault has occurred in the second load 36 of the second system ES2, if the specific fuse is blown at time t13, the second voltage V2 increases. If the second voltage V2 increases to the threshold voltage Vth at time t14, the control device 40 determines that voltage restoration has occurred in the second system ES2. Based on this determination, the control device 40 opens the inter-system switch SW at t15. Hence, the remaining loads of the second system ES2 can be used, and electrical power can be redundantly supplied to the remaining loads.

In contrast, as illustrated by the broken lines in FIG. 4, in a case in which voltage reduction in the second system ES2 continues though ΔSOC of the storage battery 16 increases to the threshold value variation, the inter-system switch SW is maintained in the state in which the inter-system switch SW is opened.

According to the present embodiment described above, the following effects can be obtained.

In the present embodiment, in a case in which the first load 34 and the second load 36 are driven in a state in which the inter-system switch SW is closed, when voltage in the first system ES1 is monitored, and it is determined that voltage reduction has occurred, a state, that is, a half-on state, is set in which the inter-system switch SW is allowed to conduct electricity in a state in which the conduction current ISW of the inter-system switch SW is limited during a predetermined time period from the voltage reduction. In this case, if voltage reduction occurs in the first system ES1 due to a ground fault in the first system ES1, the inter-system switch SW is set to a conduction state during the predetermined time period from the voltage reduction, and a current is applied from the storage battery 16 on the second system ES2 side to the first system ES1 side, whereby the fuse FA on the first branch path LC1 connected to the load in which a ground fault has occurred is interrupted. Hence, only the load in which a ground fault has occurred in the first system ES1 is separated from the first system ES1, whereby remaining loads can be used. In addition, in a case in which the inter-system switch SW is set to a conduction state, the conduction current ISW of the inter-system switch SW is limited, whereby voltage 10) reduction in the second system ES2 is suppressed even when the inter-system switch SW is set to a conduction state. Hence, operating voltage of the second load 36 is ensured, whereby problems can be suppressed from occurring in operation of the second load 36.

In the present embodiment, the switch operation unit 24 limits the conduction current ISW of the inter-system switch SW by adjusting energization resistance of the inter-system switch SW during a predetermined time period. Adjusting energization resistance of the inter-system switch SW can limit the conduction current ISW flowing from the first system ES1 side to the second system ES2 side, whereby the fuse FA can be appropriately interrupted.

In a case in which the inter-system switch SW is allowed to conduct electricity in a current limited state along with voltage reduction in the first system ES1, it can be considered that the conduction current ISW flowing to the inter-system switch SW may be unintentionally decreased depending on SOC of the power supply unit or the deterioration state of the inter-system switch. In this regard, in the present embodiment, the energization resistance of the inter-system switch SW is adjusted based on the conduction current ISW flowing to the inter-system switch SW during the predetermined time period. Hence, the fuse FA on the first system ES1 side can be desirably interrupted regardless of SOC of the storage battery 16 and the deterioration state of the inter-system switch SW.

In the present embodiment, the conduction current ISW of the inter-system switch SW during the predetermined time period is adjusted based on SOC of the storage battery 16. Hence, if the SOC of the storage battery 16 is relatively high, the conduction current ISW is made relatively large, whereby the fuse FA can be interrupted quickly. If the SOC of the storage battery 16 is relatively low, the conduction current ISW is made relatively small, whereby the storage battery 16 can be suppressed from entering an over discharge state.

In the present embodiment, if the first voltage V1 shifts to increase due to the interruption of the fuse FA and it is determined that voltage restoration has occurred from the voltage reduction, the limitation of the conduction current ISW of the inter-system switch SW is cancelled. Hence, after the load in which a ground fault has occurred in the first system ES1 is separated from the first system ES1, electrical power supply to remaining loads in which no ground fault has occurred can restart at an appropriate timing.

In the first system ES1, a ground fault may occur not only in at least one of the plurality of loads included in the first load 34 and the general load 30 but also in the first main path LD1 before branching to the first branch paths LC1. When a ground fault has occurred in the first main path LD1, even if the conduction current ISW flows from the storage battery 16 on the second system ES2 side to the first system ES1 side, the fuse FA is not interrupted, and a continuous flow of the conduction current ISW unnecessarily consumes electrical power of the storage battery 16.

In this regard, in the present embodiment, after it is determined that voltage reduction has occurred in the first system ES1, if the conduction time period has elapsed with voltage restoration not occurring from the voltage reduction, the inter-system switch SW is opened. In this case, under a state in which a ground fault has occurred on the first main path LD1, even if conduction current ISW flows from the storage battery 16 on the second system ES2 side to the first system ES1 side, the fuse FA does not blow in the first system ES1, and the inter-system switch SW is opened based on no voltage restoration having occurred. Hence, discharge from the storage battery 16 to the first system ES1 side is suppressed from continuing, whereby electrical power of the storage battery 16 can be suppressed from being unnecessarily consumed.

If current limited energization from the storage battery 16 on the second system ES2 side to the first system ES1 side is performed, SOC of the storage battery 16 decreases during a time period during which the energization is performed. In this case, the SOC of the storage battery 16 is a parameter (discharge parameter) that can be obtained as the discharge amount of the storage battery 16. In addition, according to the state of change of the discharge parameter, during a time period during which the current limited energization is performed, it can be determined that discharge required for interrupting a fuse has been performed from the storage battery 16. In this regard, in the present embodiment, since it is determined whether the conduction time period has elapsed based on the SOC of the storage battery 16, which is a discharge parameter, the current limited energization can be performed during an appropriate time period.

In the configuration including the power supply device 10 and the storage battery 16, if no ground fault has occurred in either of the systems ES1 and ES2, electrical power is redundantly supplied to the first load 34 and the second load 36 from the power supply device 10 and the storage battery 16. In such a configuration, if voltage reduction has occurred due to a ground fault in the first system ES1, voltage generation by the converter 12 of the power supply device 10 is stopped. Hence, an overcurrent in the converter 12 is suppressed, whereby the power supply device 10 including the converter 12 can be protected. However, in this case, the fuse FA cannot be interrupted by energization from the power supply device 10. In this regard, in the present embodiment, the inter-system switch SW is allowed to conduct electricity in a current limited state, and current flows from the storage battery 16 on the second system ES2 side to the first system ES1 side, whereby the fuse can be appropriately interrupted.

In a state in which the inter-system switch SW is closed in the power supply system 100, even if a ground fault has occurred in any of the first system ES1 and the second system ES2, voltage reduction occurs in the first system ES1. In this case, when a ground fault has occurred in the second system ES2, fuse interruption is not required on the first system ES1 side. In this regard, according to the present embodiment, if it is determined that voltage reduction has occurred in the first system ES1, the direction in which the conduction current ISW follows to the inter-system switch SW is determined. In addition, if it is determined that the conduction current ISW flows from the first system ES1 to the second system ES2, the inter-system switch SW is opened. Hence, the inter-system switch SW can be appropriately opened and closed.

Modifications of First Embodiment

Instead of determining that the conduction time period has elapsed using SOC of the storage battery 16, the switch operation unit 24 may determine that the conduction time period has elapsed using elapsed time from voltage reduction in the first system ES1. In addition, an integrated current value, which is an integration value of the conduction currents ISW obtained from the voltage reduction in the first system ES1, may be acquired, and it may be determined that the conduction time period has elapsed if the integrated current value has exceeded a predetermined threshold integration value. In addition, if the temperature of the inter-system switch SW acquired using the temperature sensor 29 has exceeded a threshold temperature, it may be determined that the predetermined time period has elapsed.

At the time of discharge from the storage battery 16 on the second system ES2 side to the first system ES1 side, the discharge amount increases as time elapses, and the integrated current value and the temperature of the inter-system switch SW increase depending on the increase of the discharge amount. Hence, determining that the predetermined time period has elapsed using elapsed time from voltage reduction in the first system ES1 and the increased amount of the integrated current value of the conduction current ISW can suppress the storage battery 16 from entering an over discharge state. In addition, determining that the predetermined time period has elapsed using the increased amount of the temperature of the inter-system switch SW can suppress the temperature of the inter-system switch SW from excessively increasing due to the increase of the integrated current value while suppressing the storage battery 16 from entering an over discharge state.

Second Embodiment

Hereinafter, a second embodiment will be described focusing on differences from the first embodiment with reference to FIG. 5 and FIG. 6.

Figure 5:
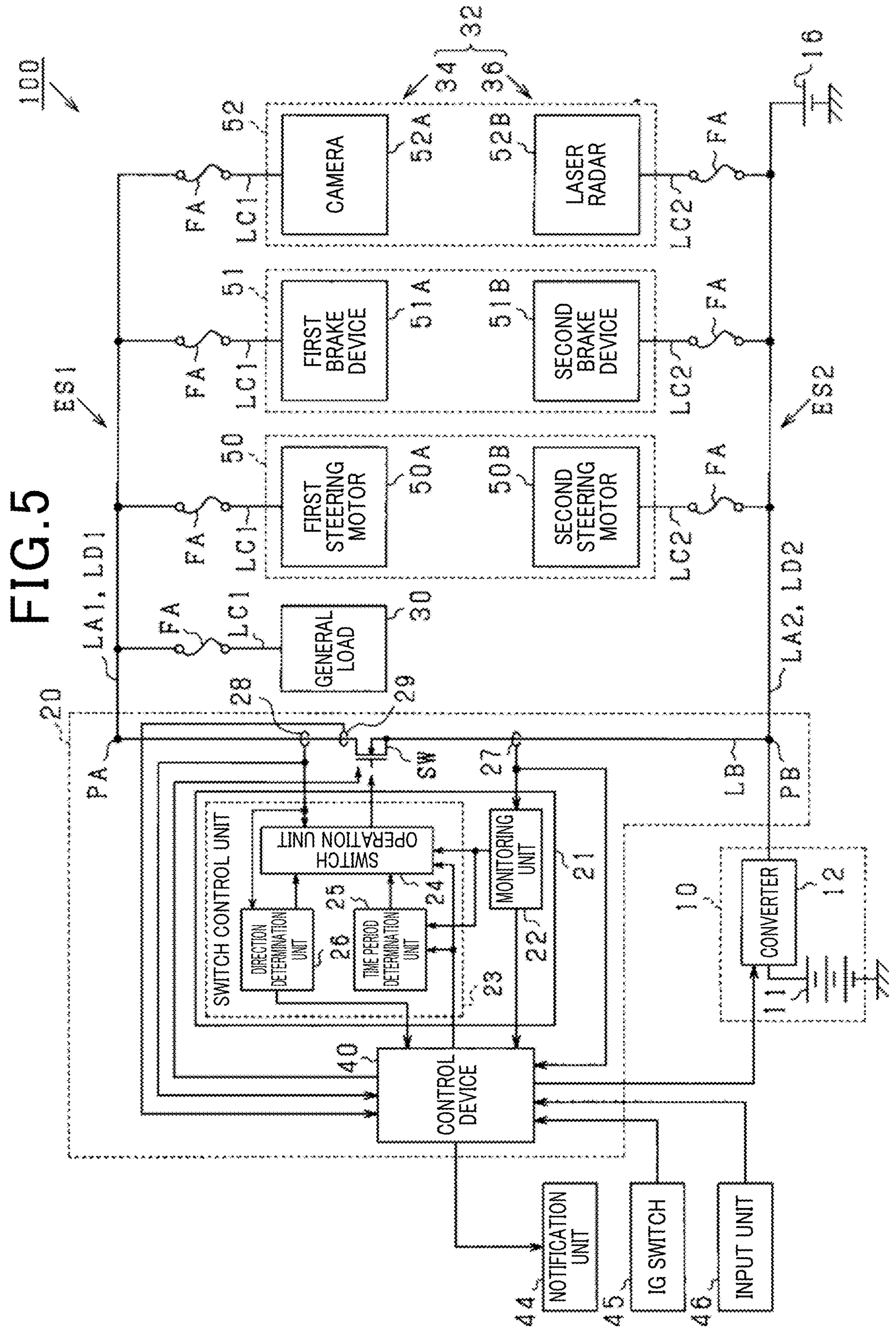
FIG. 5 is a diagram illustrating an overall configuration of a power supply monitoring system according to a second embodiment.

As illustrated in FIG. 5, in the present embodiment, the power supply device 10 is provided to the second system ES2. That is, the present embodiment differs from the first embodiment in that the power supply unit supplying electrical power to the first and second loads 34, 36 and the general load 30 is provided only to the second system ES2 and is not provided to the first system ES1. In addition, in the present embodiment, the converter monitoring device 13 is not provided.

Figure 6:
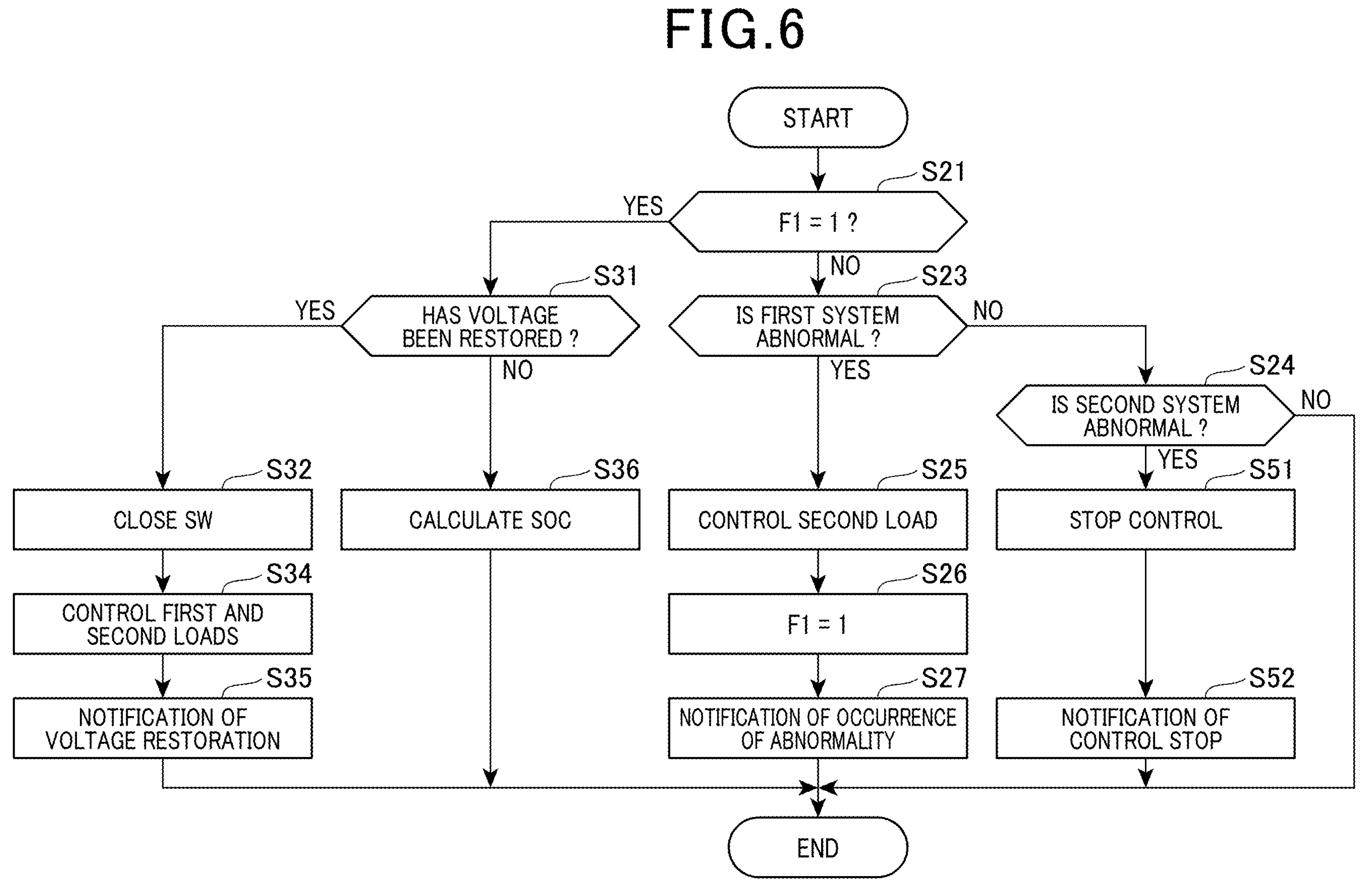
FIG. 6 is a flowchart illustrating a procedure of a control process according to the second embodiment.

FIG. 6 illustrates a flowchart of a control process according to the present embodiment. In FIG. 6, the same processing as that illustrated in FIG. 2 is omitted for the sake of convenience by adding the same step number.

Since no power supply unit is provided to the first system ES1 in the present embodiment, if an abnormality occurs in the second system ES2, electric power cannot be supplied to the first load 34 on the first system ES1 side in which no abnormalities have occurred. Hence, if an abnormality occurs in the second system ES2, the control device 40 stops the control of the first and second loads 34, 36 without setting the second abnormity flag F2.

Specifically, in the control process of the present embodiment, in step S21, if it is determined that the first abnormity flag F1 is 0, the present process proceeds to step S23. In addition, in step S24, if it is determined that an abnormity has occurred in the first system ES1, in step S51, the control of the first and second loads 34, 36 is stopped. In succeeding step S52, a notification of the control stop is provided to the driver via the notification unit 44, and the present process halts.

The power supply system 100 describe above includes the second system ES2, which is a main system to which the power supply device 10 and the storage battery 16 are provided, and the first system ES1, which is a sub-system having no power supply unit. In the present embodiment, in the above configuration, if a ground fault has occurred in at least one of the plurality of loads included in the sub-system, the inter-system switch SW is set to a half-on state. Hence, while problems are suppressed from occurring in operation of the loads of the main system, only the load in which the ground fault has occurred in the sub-system can be separated from the sub-system, whereby the remaining loads can be used.

Other Embodiments

The present disclosure is not limited to the above embodiments and may be implemented as below.

The loads 34, 36 may be, for example, the following devices.

The loads 34, 36 may be a traveling motor applying traveling power to the vehicle and a drive circuit thereof. In this case, the first and second loads 34, 36 may be, for example, a three-phase permanent magnet synchronous motor and a three-phase inverter device, respectively.

The loads 34, 36 may be an antilock braking device that prevents wheels from becoming locked during braking. In this case, each of the first and second loads 34, 36 is, for example, an ABS actuator that can independently adjust brake hydraulic pressure during braking.

The loads 34, 36 are not necessarily a combination of the same configurations but may be a combination of different types of devices that implement equivalent functions. In addition, the first and second loads 34, 36 may not be different loads but be the same load. That is, the first and second loads 34, 36 may be the same load that is supplied with electrical power from both of the first in-system path LA1 and the second in-system path LA2.

The loads 34, 36 may be components for implementing the same function. In this case, the first and second loads 34, 36 are, for example, an actuator and an electrical power steering ECU of an electrical power steering device, respectively. In this case, the electrical power steering ECU may be supplied with electrical power from both of the first in-system path LA1 and the second in-system path LA2.

In the above embodiments, although the control process performed in the normal mode has been described, the control process may be performed in the assist mode. In this case, during the assist mode, if a ground fault has occurred in the loads 30, 34 of the first system ES1 or the second load 36 of the second system ES2, since the control using the first and second loads 34, 36 can be performed by the specific fuse blowing, the assist mode may be continued. In contrast, if a ground fault has occurred in the first main path LD1 of the first system ES1 or the second main path LD2 of the second system ES2, since one of the first load 34 and the second load 36 cannot be used, the operation mode may be changed from the assist mode to the normal mode.

Figure 7:
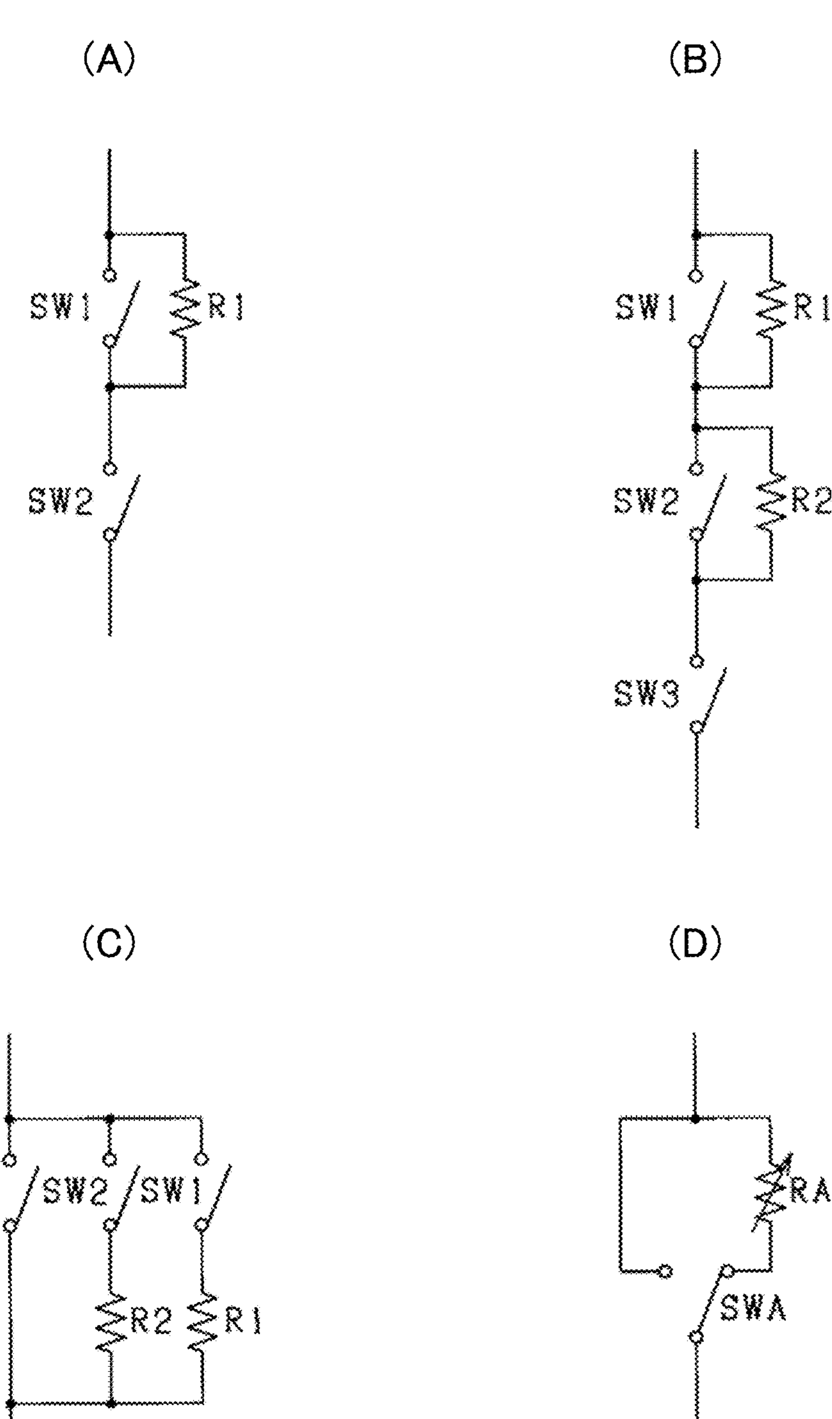
FIG. 7 is a diagram illustrating another example of an inter-system switch.

In the above embodiments, although the inter-system switch SW is a MOSFET, this is not the limitation. As illustrated in FIGS. 7(A) to (C), the inter-system switch SW may be configured by contact switching type switches (hereinafter, mechanical switches) SW1 to SW3 and resistance elements R1, R2. In this case, as illustrated in FIGS. 7(B), (C), since the inter-system switch SW includes a plurality of resistance elements R1, R2 having different resistance values, energization resistance of the inter-system switch SW can be adjusted in a half-on state. It is noted that the number of resistance elements 25 included in the inter-system switch SW is not limited to one or two and may be three or more.

In addition, as illustrated in FIG. 7(D), the resistance element may be a variable resistor RA, so that a mechanical switch SWA switches between the path passing through the variable resistor RA and the path not passing through the variable resistor RA.

In the above embodiments, although the voltage sensor 27 is provided on the second system ES2 side with respect to the inter-system switch SW, the voltage sensor 27 may be provided on the first system ES1 side with respect to the inter-system switch SW. Hence, if a ground fault has occurred in the first system ES1, it can be determined that voltage restoration has occurred in the first system ES1, based on the first voltage V1.

In the above embodiments, although it is determined that the predetermined time period has elapsed based on the state of change of a discharge parameter such as SOC of the storage battery 16, this is not the limitation. For example, the predetermined time period may be a set time period predetermined based on a predicted discharge amount of the storage battery 16.

In the above embodiments, although the control device 40 opens the inter-system switch SW after the voltage restoration in the first and second systems ES1, ES2, the switch operation unit 24 may perform the above opening operation.

In the above embodiments, although the switch operation unit 24 opens the inter-system switch SW when no voltage restoration has occurred in the first and second systems ES1, ES2, the control device 40 may perform the above opening operation.

In the above embodiments, although the monitoring unit and the switch control unit are configured by hardware circuits including various circuits, this is not the limitation. The monitoring unit and the switch control unit may be configured by a microcomputer including a CPU, a ROM, a RAM, a flash memory, and the like.

In the above embodiments, although the power supply unit is a lithium-ion storage battery, this is not the limitation. The power supply unit may be another type of storage battery or an electrical double layer capacitor.

Hereinafter, characteristic configurations extracted from the embodiments described above will be described.

[Configuration 1]

A power supply monitoring device (20) that is applied to a power supply system (100), the power supply system including a first system (ES1) having a first load (34) and a second system (ES2) having a second load (36), the first system and the second system being connectable to each other by an inter-system switch (SW), the second system being connected with a power supply unit (16), wherein in the first system, a plurality of electrical loads are connected in parallel as the first load, and fuses (FA) are respectively provided to energization paths connected to the electrical loads, and the power supply monitoring device includes:

a monitoring unit (22) that monitors voltage reduction in the first system when the first load and the second load are driven in a state in which the inter-system switch is closed; and a switch operation unit (24) that allows the inter-system switch to conduct electricity in a state in which a conduction current in the inter-system switch is limited during a predetermined time period from voltage reduction, if the monitoring unit determines that the voltage reduction has occurred.

[Configuration 2]

The power supply monitoring device according to configuration 1, wherein the inter-system switch is configured to vary energization resistance during energization, and the switch operation unit limits the conduction current in the inter-system switch by adjusting the energization resistance of the inter-system switch during the predetermined time period.

[Configuration 3]

The power supply monitoring device according to configuration 2, wherein the switch operation unit acquires the conduction current flowing to the inter-system switch during the predetermined time period and adjusts the energization resistance of the inter-system switch based on the conduction current.

[Configuration 4]

The power supply monitoring device according to any one of configurations 1 to 3, wherein the power supply unit includes an electrical storage device (16), and the power supply monitoring device further includes a current adjustment unit (24) that adjusts the conduction current in the inter-system switch during the predetermined time period based on SOC of the electrical storage device.

[Configuration 5]

The power supply monitoring device according to any one of configurations 1 to 4, further including:

a restoration determination unit (40) that determines whether voltage restoration has occurred from voltage reduction, after the monitoring unit determines that the voltage reduction has occurred, and a restoration operation unit (40) that cancels the limitation of the conduction current in the inter-system switch by the switch operation unit to restore the inter-system switch to a conduction state in which there is no current limitation, if the restoration determination unit determines that the voltage restoration has occurred.

[Configuration 6]

The power supply monitoring device according to configuration 5, wherein after the monitoring unit determines that voltage reduction has occurred, the switch operation unit opens the inter-system switch if a predetermined conduction time period has elapsed with voltage restoration not occurring from the voltage reduction.

[Configuration 7]

The power supply monitoring device according to configuration 6, wherein after the monitoring unit determines that the voltage reduction has occurred, the switch operation unit determines whether the conduction time period has elapsed based on a discharge amount of the power supply unit and a discharge parameter that is a correlation value of the discharge amount, and if the conduction time period has elapsed with voltage restoration not occurring from the voltage reduction, the switch operation unit opens the inter-system switch.

[Configuration 8]

The power supply monitoring device according to any one of configurations 1 to 7, wherein the power supply system includes a first power supply unit (10) connected to the first system and a second power supply unit (16) serving as the power supply unit connected to the second system, the first power supply unit includes a voltage converter (12) that generates operating voltage of the first load and the second load, the second power supply unit includes an electrical storage device (16) capable of being charged by the operating voltage of the voltage converter, and if voltage reduction in the first system has occurred, voltage generation by the voltage converter is stopped, and the switch operation unit allows the inter-system switch to conduct electricity in a state in which the conduction current in the inter-system switch is limited.

[Configuration 9]

The power supply monitoring device according to configuration 8, further including a direction determination unit that determines a direction in which the conduction current flows to the inter-system switch, wherein if the monitoring unit determines that the voltage reduction has occurred, and the direction determination unit determines that the conduction current flows from the first system to the second system, the switch operation unit opens the inter-system switch.

The present disclosure has so far been described based on embodiments. However, the present disclosure should not be construed as being limited to these embodiments or the structures. The present disclosure should encompass various modifications, or modifications within the range of equivalence. In addition, various combinations and modes, as well as other combinations and modes, including those which include one or more additional elements, or those which include fewer elements should be construed as being within the scope and spirit of the present disclosure.

A first aspect of the present disclosure is a power supply monitoring device (20) that is applied to a power supply system (100), the power supply system including a first system (ES1) having a first load (34) and a second system (ES2) having a second load (36), the first system and the second system being connectable to each other by an inter-system switch (SW), the second system being connected with a power supply unit (16). In the first system, a plurality of electrical loads are connected in parallel as the first load, and fuses (FA) are respectively provided to energization paths connected to the electrical loads. The power supply monitoring device includes: a monitoring unit (22) that monitors voltage reduction in the first system when the first load and the second load are driven in a state in which the inter-system switch is closed; and a switch operation unit (24) that allows the inter-system switch to conduct electricity in a state in which a conduction current in the inter-system switch is limited during a predetermined time period from voltage reduction, if the monitoring unit determines that the voltage reduction has occurred.

If a ground fault occurs in any of the plurality of electrical loads, which is the first load, there is a concern that excessive current flows through the energization path connected to the electrical load and power supply failure occurs in the power supply unit. Hence, the inter-system switch is opened. However, in this case, even in a state in which a ground fault has occurred in one of the plurality of electrical loads in the first load, the whole first system cannot be used.

In this regard, in the above configuration, voltage reduction in the first system is monitored when the first load and the second load are driven in a state in which the inter-system switch is closed. The inter-system switch is allowed to conduct electricity in a state in which a conduction current in the inter-system switch is limited during a predetermined time period from voltage reduction, if it is determined that the voltage reduction has occurred. In this case, if voltage reduction occurs in the first system due to a ground fault in the first system, the inter-system switch is set to a conduction state during the predetermined time period from the voltage reduction, and a current is applied from the power supply unit on the second system side to the first system side, whereby the fuse on the energizing path connected to the electrical load in which a ground fault has occurred is interrupted. Hence, only the electrical load in which a ground fault has occurred in the first system is separated from the first system, whereby remaining electrical loads can be used. In addition, in a case in which the inter-system switch is set to a conduction state, the conduction current of the inter-system switch is limited, whereby voltage reduction in the second system is suppressed even when the inter-system switch is set to a conduction state. Hence, operating voltage of the second load is ensured, whereby problems can be suppressed from occurring in operation of the second load.

In a second aspect, the inter-system switch is configured to vary energization resistance during energization, and the switch operation unit limits the conduction current in the inter-system switch by adjusting the energization resistance of the inter-system switch during the predetermined time period.

According to the above configuration, adjusting energization resistance of the inter-system switch can limit the conducting current flowing from the first system side to the second system side, whereby the fuse can be appropriately interrupted.

In a third aspect, the switch operation unit acquires the conduction current flowing to the inter-system switch during the predetermined time period and adjusts the energization resistance of the inter-system switch based on the conduction current.

In a case in which the inter-system switch is allowed to conduct electricity in a current limited state along with voltage reduction in the first system, it can be considered that the conduction current flowing to the inter-system switch may be unintentionally decreased depending on SOC of the power supply unit or the deterioration state of the inter-system switch. In this regard, according to the above configuration, the conduction current of the inter-system switch can be appropriately controlled, and the fuse on the first system side can be desirably interrupted regardless of SOC of the power supply unit and the deterioration state of the inter-system switch.

In a fourth aspect, the power supply unit includes an electrical storage device (16), and the power supply monitoring device further includes a current adjustment unit (24) that adjusts the conduction current in the inter-system switch during the predetermined time period based on SOC of the electrical storage device.

According to the above configuration, if the SOC of the electrical storage device is relatively high, the conduction current of the inter-system switch during the predetermined time period is made relatively large, whereby the fuse can be interrupted quickly. If the SOC of the electrical storage device is relatively low, the conduction current is made relatively small, whereby the electrical storage device can be suppressed from entering an over discharge state.

In a fifth aspect, the power supply monitoring device further includes a restoration determination unit (40) that determines whether voltage restoration has occurred from voltage reduction, after the monitoring unit determines that the voltage reduction has occurred, and a restoration operation unit (40) that cancels the limitation of the conduction current in the inter-system switch by the switch operation unit to restore the inter-system switch to a conduction state in which there is no current limitation, if the restoration determination unit determines that the voltage restoration has occurred.

According to the above configuration, if the voltage of the first system shifts to increase due to the interruption of the fuse and it is determined that voltage restoration has occurred from the voltage reduction, the limitation of the conduction current of the inter-system switch is cancelled. Hence, after the electrical load in which a ground fault has occurred in the first system is separated from the first system, electrical power supply to remaining electrical loads in which no ground fault has occurred can restart at an appropriate timing.

In a sixth aspect, after the monitoring unit determines that voltage reduction has occurred, the switch operation unit opens the inter-system switch if a predetermined conduction time period has elapsed with voltage restoration not occurring from the voltage reduction.

In the first system, a ground fault may occur not only in any of the plurality of electrical loads but also in the main path before branching to the electrical loads. When a ground fault has occurred in the main path, even if current flows from the power supply unit on the second system side to the first system side, the fuse is not interrupted, and a continuous flow of the current unnecessarily consumes electrical power of the power supply unit.

In this regard, in the above configuration, after it is determined that voltage reduction has occurred in the first system, if the conduction time period has elapsed with voltage restoration not occurring from the voltage reduction, the inter-system switch is opened. In this case, under a state in which a ground fault has occurred on the main path, even if current flows from the power supply unit on the second system side to the first system side, the fuse is not interrupted in the first system, and the inter-system switch is opened based on no voltage restoration having occurred. Hence, discharge from the power supply unit to the first system side is suppressed from continuing, whereby electrical power of the power supply unit can be suppressed from being unnecessarily consumed.

In a seventh aspect, after the monitoring unit determines that the voltage reduction has occurred, the switch operation unit determines whether the conduction time period has elapsed based on a discharge amount of the power supply unit and a discharge parameter that is a correlation value of the discharge amount, and if the conduction time period has elapsed with voltage restoration not occurring from the voltage reduction, the switch operation unit opens the inter-system switch.

If current limited energization from the power supply unit on the second system side to the first system side is performed, SOC of the power supply unit decreases, the temperature of the inter-system switch increases, or an integrated current value increases during a time period during which the energization is performed. In this case, the SOC of the power supply unit, the temperature of the inter-system switch, and the integrated current value are parameters that can be obtained as the discharge amount of the power supply unit. According to the state of change of the discharge parameters, during a time period during which the current limited energization is performed, it can be determined that discharge required for interrupting a fuse has been performed from the power supply unit. In this regard, according to the above configuration, since it is determined whether the conduction time period has elapsed based on the discharge parameter, the current limited energization can be performed during an appropriate time period.

In an eighth aspect, the power supply system includes a first power supply unit (10) connected to the first system and a second power supply unit (16) serving as the power supply unit connected to the second system, the first power supply unit includes a voltage converter (12) that generates operating voltage of the first load and the second load, the second power supply unit includes an electrical storage device (16) capable of being charged by the operating voltage of the voltage converter, and if voltage reduction in the first system has occurred, voltage generation by the voltage converter is stopped, and the switch operation unit allows the inter-system switch to conduct electricity in a state in which the conduction current in the inter-system switch is limited.

In the configuration including the first power supply unit and the second power supply unit, if no ground fault has occurred in either of the systems, electrical power is redundantly supplied to the first load and the second load from the first power supply unit and the second power supply unit. In such a configuration, if voltage reduction has occurred due to a ground fault in the first system, voltage generation by the voltage converter of the first power supply unit is stopped. Hence, an overcurrent in the voltage converter is suppressed, whereby the first power supply unit including the voltage converter can be protected. However, in this case, the fuse cannot be interrupted by energization from the first power supply unit. In this regard, the inter-system switch is allowed to conduct electricity in a current limited state, and current flows from the electrical storage device of the second power supply unit to the first system side, whereby the fuse can be appropriately interrupted.

In a ninth aspect, the power supply monitoring device further includes a direction determination unit (26) that determines a direction in which the conduction current flows to the inter-system switch if the monitoring unit determines that the voltage reduction has occurred. If the monitoring unit determines that the voltage reduction has occurred, and the direction determination unit determines that the conduction current flows from the first system to the second system, the switch operation unit opens the inter-system switch.

In a state in which the inter-system switch is closed in the power supply system, even if a ground fault has occurred in any of the first system and the second system, voltage reduction occurs in the first system. In this case, when a ground fault has occurred in the second system, fuse interruption is not required on the first system side. In this regard, according to above configuration, if it is determined that voltage reduction has occurred in the first system, the direction in which the conduction current follows to the inter-system switch is determined. In addition, if it is determined that the conduction current flows from the first system to the second system, the inter-system switch is opened. Hence, the inter-system switch can be appropriately opened and closed.

What is claimed is:

1. A power supply monitoring device that is applied to a power supply system, the power supply system including a first system having a first load and a second system having a second load, the first system and the second system being connectable to each other by an inter-system switch, the second system being connected with a power supply unit, wherein in the first system, a plurality of electrical loads are connected in parallel as the first load, and fuses are respectively provided to energization paths connected to the electrical loads, the power supply monitoring device comprises:

a monitoring unit that monitors voltage reduction in the first system when the first load and the second load are driven in a state in which the inter-system switch is closed; and a switch operation unit that allows the inter-system switch to conduct electricity in a state in which a conduction current in the inter-system switch is limited during a predetermined time period from voltage reduction, if the monitoring unit determines that the voltage reduction has occurred, the inter-system switch is configured to vary energization resistance during energization, the switch operation unit limits the conduction current in the inter-system switch by adjusting the energization resistance of the inter-system switch during the predetermined time period, and the switch operation unit acquires the conduction current flowing to the inter-system switch during the predetermined time period and adjusts the energization resistance of the inter system switch based on the conduction current.

2. The power supply monitoring device according to claim 1, wherein the power supply unit includes an electrical storage device, and the power supply monitoring device further comprises a current adjustment unit that adjusts the conduction current in the inter-system switch during the predetermined time period based on SOC of the electrical storage device.

3. A power supply monitoring device that is applied to a power supply system, the power supply system including a first system having a first load and a second system having a second load, the first system and the second system being connectable to each other by an inter-system switch, the second system being connected with a power supply unit, wherein in the first system, a plurality of electrical loads are connected in parallel as the first load, and fuses are respectively provided to energization paths connected to the electrical loads, the power supply monitoring device comprises;

a monitoring unit that monitors voltage reduction in the first system when the first load and the second load are driven in a state in which the inter-system switch is closed; and a switch operation unit that allows the inter-system switch to conduct electricity in a state m which a conduction current in the inter-system switch is limited during a predetermined time period from voltage reduction, if the monitoring unit determines that the voltage reduction has occurred, the power supply monitoring device further comprises:

a restoration determination unit that determines whether voltage restoration has occurred from voltage reduction, after the monitoring unit determines that the voltage reduction has occurred, and a restoration operation unit that cancels the limitation of the conduction current in the inter-system switch by the switch operation unit to restore the inter-system switch to a conduction state in which there is no current limitation, if the restoration determination unit determines that the voltage restoration has occurred.

4. The power supply monitoring device according to claim 3, wherein after the monitoring unit determines that voltage reduction has occurred, the switch operation unit opens the inter-system switch if a predetermined conduction time period has elapsed with voltage restoration not occurring from the voltage reduction.

5. The power supply monitoring device according to claim 4, wherein after the monitoring unit determines that the voltage reduction has occurred, the switch operation unit determines whether the conduction time period has elapsed based on a discharge amount of the power supply unit and a discharge parameter that is a correlation value of the discharge amount, and if the conduction time period has elapsed with voltage restoration not occurring from the voltage reduction, the switch operation unit opens the inter-system switch.

6. A power supply monitoring device that is applied to a power supply system, the power supply system including a first system having a first load and a second system having a second load, the first system and the second system being connectable to each other by an inter-system switch, the second system being connected with a power supply unit, wherein in the first system, a plurality of electrical loads are connected in parallel as the first load, and fuses are respectively provided to energization paths connected to the electrical loads, the power supply monitoring device comprises:

a monitoring unit that monitors voltage reduction in the first system when the first load and the second load are driven in a state in which the inter-system switch is closed; and a switch operation unit that allows the inter-system switch to conduct electricity in a state in which a conduction current in the inter-system switch is limited during a predetermined time period from voltage reduction, if the monitoring unit determines that the voltage reduction has occurred, and the power supply system includes a first power supply unit connected to the first system and a second power supply unit serving as the power supply unit connected to the second system.

7. The power supply monitoring device according to claim 6, wherein the first power supply unit includes a voltage converter that generates operating voltage of the first load and the second load, the second power supply unit includes an electrical storage device capable of being charged by the operating voltage of the voltage converter, and if voltage reduction in the first system has occurred, voltage generation by the voltage converter is stopped, and the switch operation unit allows the inter-system switch to conduct electricity in a state in which the conduction current in the inter-system switch is limited.

8. The power supply monitoring device according to claim 7, further comprising a direction determination unit that determines a direction in which the conduction current flows to the inter-system switch, wherein if the monitoring unit determines that the voltage reduction has occurred, and the direction determination unit determines that the conduction current flows from the first system to the second system, the switch operation unit opens the inter-system switch.

* * * * *